US011550223B2

(12) United States Patent
Xiong

(10) Patent No.: US 11,550,223 B2
(45) Date of Patent: Jan. 10, 2023

(54) COATING METHOD AND COATING SYSTEM

(71) Applicant: CHONGQING KONKA PHOTOELECTRIC TECHNOLOGY RESEARCH INSTITUTE CO., LTD., Chongqing (CN)

(72) Inventor: Chaochao Xiong, Chongqing (CN)

(73) Assignee: CHONGQING KONKA PHOTOELECTRIC TECHNOLOGY RESEARCH INSTITUTE CO., LTD., Chongqing (CN)

( * ) Notice: Subject to any disclaimer, the term of this patent is extended or adjusted under 35 U.S.C. 154(b) by 1 day.

(21) Appl. No.: 17/377,421

(22) Filed: Jul. 16, 2021

(65) Prior Publication Data
US 2021/0364923 A1 Nov. 25, 2021

Related U.S. Application Data

(63) Continuation of application No. PCT/CN2020/115247, filed on Sep. 15, 2020.

(30) Foreign Application Priority Data

May 25, 2020 (CN) .......................... 202010449093.1

(51) Int. Cl.
*G03F 7/16* (2006.01)
*H01L 21/027* (2006.01)

(52) U.S. Cl.
CPC .............. *G03F 7/162* (2013.01); *G03F 7/168* (2013.01); *H01L 21/0272* (2013.01); *H01L 21/0273* (2013.01)

(58) Field of Classification Search
CPC .................................. G03F 7/162; G03F 7/168
See application file for complete search history.

(56) References Cited

U.S. PATENT DOCUMENTS

| 4,268,603 A * | 5/1981 | Sato ....................... G03F 7/0085 430/196 |
| 2001/0033895 A1 | 10/2001 | Minami et al. |
| 2006/0223336 A1* | 10/2006 | Wei ........................ B05D 1/005 438/782 |

(Continued)

FOREIGN PATENT DOCUMENTS

| CN | 101781764 A | 7/2010 |
| CN | 107177239 A | 9/2017 |
| CN | 107408502 A | 11/2017 |

(Continued)

OTHER PUBLICATIONS

International Search Report for corresponding application PCT/CN2020/115247 filed Sep. 15, 2020; dated Feb. 24, 2021.

*Primary Examiner* — James M Mellott
(74) *Attorney, Agent, or Firm* — Gang Yu

(57) ABSTRACT

The present disclosure provides a coating method and a coating system. The coating method comprises: providing a substrate, and dropping a first liquid onto the substrate; dropping, onto the first liquid, a second liquid which is immiscible with the first liquid and has a density greater than that of the first liquid; and rotating the substrate, such that the first liquid is diffused on the surface of the substrate, and the second liquid is diffused on the surface of the first liquid.

14 Claims, 2 Drawing Sheets

(56) References Cited

U.S. PATENT DOCUMENTS

2009/0291198 A1* 11/2009 Yoshihara ........... H01L 21/6715
427/299
2012/0193763 A1   8/2012 Yamaguchi

FOREIGN PATENT DOCUMENTS

CN    110088880 A   8/2019
WO    2020059315 A1   3/2020

* cited by examiner

COATING METHOD AND COATING SYSTEM

CROSS REFERENCE

This application is a National Stage Filing of the PCT International Application No. PCT/CN2020/115247 filed on Sep. 15, 2020, which claims priority to Chinese Application No. 2020104490931, the entirety of which is herein incorporated by reference.

TECHNICAL FIELD

The present disclosure relates to the field of semiconductor manufacturing, and in particular, to a coating method and a coating system.

BACKGROUND

In a semiconductor manufacturing process, it is often needed to coat a photoresist on a substrate. When coating the photoresist on the substrate, the substrate is first fixedly provided on a bearing surface of a rotary table, and then a certain amount of photoresist is sprayed on the central region of the surface of the substrate by using a nozzle. Afterwards, the rotary table is controlled to rotate to drive the substrate to rotate around the center of the substrate. During the rotation of the substrate, the photoresist at the central region of the surface of the substrate is diffused to the peripheral region under the action of a centrifugal force, and finally a photoresist layer is formed on the surface of the substrate.

However, in the diffusion process of the photoresist, as the viscosity of the photoresist is usually large, the thickness of the photoresist coated on the substrate is non-uniform, thereby affecting the product quality of a manufactured semiconductor.

Therefore, there is a need to develop and improve the related technology.

SUMMARY

In view of the described deficiency of the related technology, some embodiments of the present disclosure provide a coating method and a coating system, which may solve the technical problem of non-uniform thickness after coating a photoresist using the existing coating method, thereby affecting the product quality.

In one aspect, some embodiments of the present disclosure provide a coating method, comprising:

providing a substrate, and dropping a first liquid onto the substrate;

dropping a second liquid onto the first liquid, wherein the first liquid and the second liquid are immiscible, and the first liquid has a density greater than that of the second liquid; and rotating the substrate, such that the first liquid is diffused on the surface of the substrate, and the second liquid is diffused on the surface of the first liquid.

In the described implementation process, as the second liquid which is immiscible with the first liquid is dropped onto the first liquid, and the density of the first liquid is greater than the density of the second liquid, the second liquid can always be above the first liquid. When the substrate is rotated, the first liquid diffuses towards the edge of the substrate under the action of a centrifugal force, and the second liquid diffuses on the surface of the first liquid under the action of the centrifugal force. As the surface of the first liquid is pressed by the second liquid, the thickness from the center to the edge region will be more uniform.

In some exemplary implementations of the embodiments, after dropping the first liquid onto the substrate and before dropping the second liquid onto the first liquid, the method may further comprise:

rotating the substrate, such that the first liquid diffuses, to a first area, on the surface of the substrate.

In the described implementation process, in order to facilitate the dropping of the second liquid onto the first liquid, before dropping the second liquid, the surface of the first liquid can be enlarged to the first area by rotating the substrate, so that the surface area of the first liquid is greater, thereby facilitating the dropping of the second liquid.

In some exemplary implementations of the embodiments, the coating method may further comprise:

removing the second liquid on the surface of the first liquid.

In the described implementation process, as the function of the second liquid is to press the surface of the first liquid by gravity after the first liquid is rotated and diffused, so as to make the thickness of the first liquid uniform, the second liquid needs to be removed after the diffusion of the first liquid is completed.

In some exemplary implementations of the embodiments, removing the second liquid on the surface of the first liquid comprises:

baking the first liquid and the second liquid, such that the second liquid is volatilized from the surface of the first liquid.

In the described implementation process, in the process of removing the second liquid on the surface of the first liquid, the second liquid is removed in the form of evaporation by baking. As the second liquid is located on the surface of the first liquid, in the baking process, the first liquid evaporates only after the second liquid is completely evaporated, and thus the removal of the second liquid can be accurately controlled by controlling the evaporation time.

In some exemplary implementations of the embodiments, the boiling point of the first liquid is greater than the boiling point of the second liquid.

In the described implementation process, as the boiling point of the first liquid is greater than that of the second liquid, the removal of the second liquid can be achieved by controlling the temperature to be greater than the boiling point of the second liquid and less than the boiling point of the first liquid. In this way, the evaporation time in this process does not need to be accurately controlled, and the operation is more convenient.

In some exemplary implementations of the embodiments, the first liquid comprises a photoresist.

In the described implementation process, as the photoresist has a relatively high viscosity, when the photoresist is diffusing on the substrate, the situation that the thickness at the central region and the edge region are not uniform easily occurs. For preventing the situation of non-uniformity from happening, the diffusion thickness of the photoresist needs to be adjusted, thereby improving the product quality.

In some exemplary implementations of the embodiments, the second liquid comprises perfluorooctane, tetrahydrofuran and methyl ethyl ketone.

In the described implementation process, perfluorooctane, tetrahydrofuran and methyl ethyl ketone are all common materials in semiconductor manufacturing, and thus can be easily acquired. Besides, perfluorooctane, tetrahydrofuran and methyl ethyl ketone all have relatively small boiling points, and thus can be easily removed by evaporation.

On the other hand, on the basis of the same inventive concept, some embodiments of the present disclosure provide a coating system, comprising:

a substrate;

a first liquid injection device, configured to drop a first liquid onto the substrate;

a second liquid injection device, configured to drop a second liquid onto the substrate, wherein the second liquid and the first liquid are immiscible, and the first liquid has a density greater than that of the second liquid; and a substrate rotating device, configured to drive the substrate to rotate, such that the first liquid is diffused on the surface of the substrate, and the second liquid is diffused on the surface of the first liquid.

In the described implementation process, the first liquid injection device drops the first liquid onto the substrate, the second liquid injection device drops the second liquid onto the substrate, and then the substrate is rotated by the substrate rotating device such that the first liquid is diffused on the surface of the substrate and the second liquid is diffused on the surface of the first liquid. By pressing the surface of the first liquid by means of the gravity of the second liquid, the thickness of the first liquid can be more uniform.

In some exemplary implementations of the embodiments, the coating system may further comprise:

a substrate baking device, configured to bake the first liquid and the second liquid.

In the described implementation process, the first liquid and the second liquid are diffused on the substrate and then placed into the substrate baking device for baking, so that the second liquid can be evaporated and removed from the surface of the first liquid. This process of removing the second liquid is convenient.

In some exemplary implementations of the embodiments, the first liquid comprises a photoresist, and the second liquid comprises perfluorooctane, tetrahydrofuran and methyl ethyl ketone.

In the described implementation process, the coating system is used for controlling the thickness of coated photoresist. The second liquid which comprises perfluorooctane, tetrahydrofuran and methyl ethyl ketone has good adaptability to the photoresist and is easy to remove, and can achieve a good effect of making the photoresist be coated more uniformly.

DETAILED DESCRIPTION OF THE EMBODIMENTS

Figure 1:
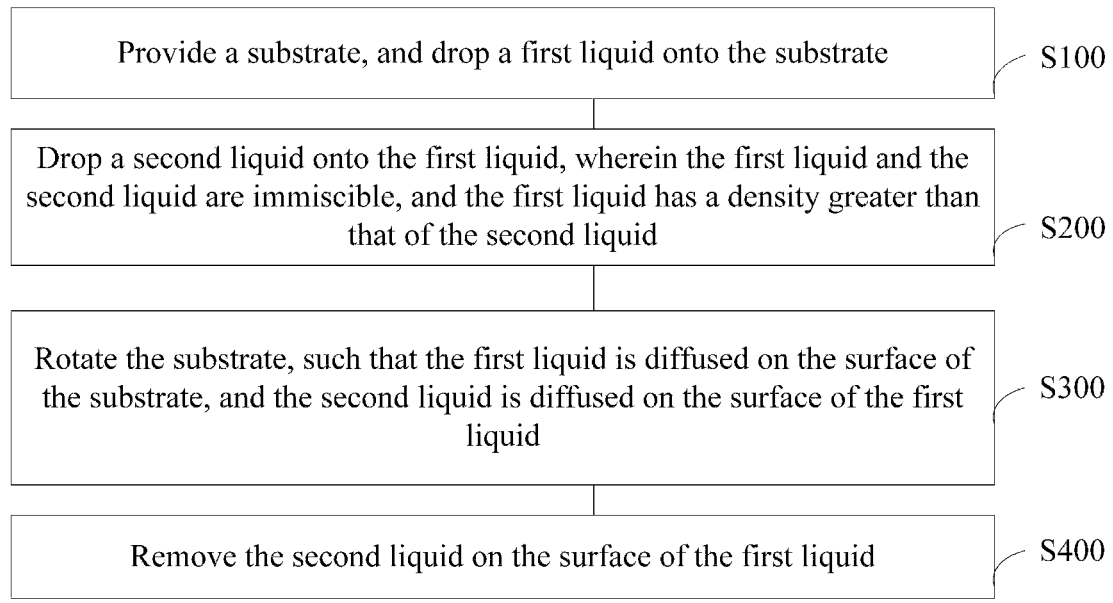
FIG. 1 is a flowchart of a coating method according to some embodiments of the present disclosure.

In order to facilitate understanding of some embodiments of the present disclosure, hereinafter, some embodiments of the present disclosure will be described more fully with reference to the related accompanying drawings. Exemplary embodiments of the present disclosure are shown in the drawings. Some embodiments of the present disclosure may, however, be embodied in many different forms and are not limited to the embodiments set forth herein. Rather, the purpose of providing these embodiments is to make the disclosure in some embodiments of the present disclosure more thorough and complete.

Unless defined otherwise, all technical and scientific terms used herein have the same meanings as those commonly understood by a person skilled in the art to which the present disclosure belongs. The terms used herein in the description of some embodiments of the present disclosure are for the purpose of describing exemplary embodiments only and are not intended to limit the embodiments of the present disclosure.

In the photoresist rotation coating process of the related technology, the photoresist is first dropped onto the substrate, and then the photoresist is made uniform by rotating. In this process, the situation that there is a large difference between the photoresist film thicknesses at the center and the edge easily occurs. Specifically, during rotation, the photoresist extends and is distributed from the center of the substrate to the edge of the substrate due to a rotational centrifugal force. However, as more photoresist is attached at the central portion of the substrate, in the rotation and distribution process, the thickness of the central region of the substrate is inevitably greater than that of the edge, so that the photoresist is not uniformly distributed on the substrate, thereby affecting the yield of subsequent processes such as photo-etching.

In view of the above, some embodiments of the present disclosure provide a solution capable of solving the described technical problem, and the detailed content thereof will be set forth in the subsequent embodiments.

Referring to FIG. 1, some embodiments of the present disclosure provide a coating method, comprising the following operations.

At S100, a substrate is provided, and a first liquid is dropped onto the substrate.

At S200, a second liquid is dropped onto the first liquid, wherein the first liquid and the second liquid are immiscible, and the first liquid has a density greater than that of the second liquid.

At S300, the substrate is rotated, such that the first liquid is diffused on the surface of the substrate, and the second liquid is diffused on the surface of the first liquid, wherein by means of the second liquid pressing the surface of the first liquid, the thickness of the first liquid is uniform.

Figure 2:
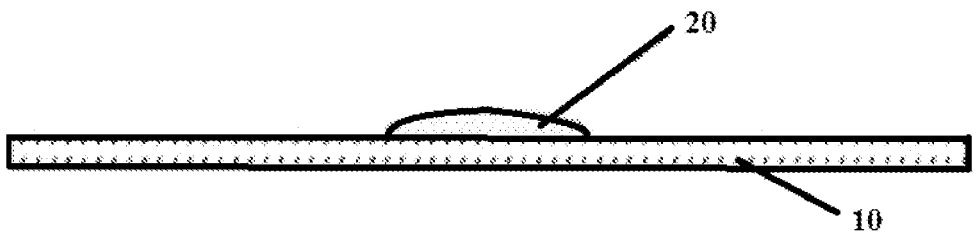
FIG. 2 is a schematic diagram of a substrate onto which a first liquid is dropped according to some embodiments of the present disclosure.
Figure 3:
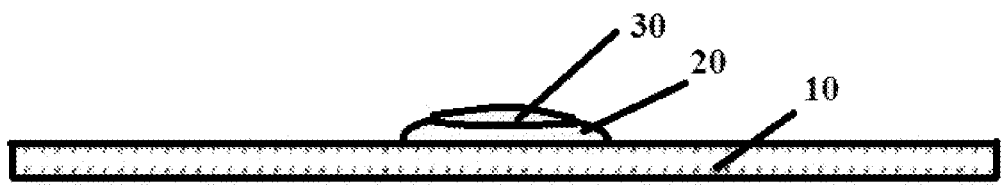
FIG. 3 is a schematic diagram of a substrate onto which a first liquid and a second liquid are dropped according to some embodiments of the present disclosure.
Figure 4:
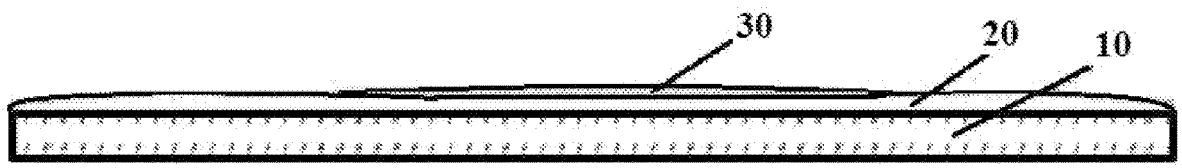
FIG. 4 is a schematic diagram of a substrate on which a first liquid and a second liquid are diffused according to some embodiments of the present disclosure.

In the coating method of some embodiments of the present disclosure, as the second liquid immiscible with the first liquid is dropped onto the first liquid and the density of the first liquid is greater than the density of the second liquid, the second liquid can always be above the first liquid. Referring to FIG. 2, when only the first liquid 20 is dropped onto the substrate 10, the thicknesses at the center and the edge of the first liquid 20 are not uniform, and thus after diffusion, there is a defect that the first liquid 20 has non-uniform thickness at the edge center and the edge of the substrate 10. Referring to FIG. 3, the second liquid 30 immiscible with the first liquid 20 is dropped onto the surface of the first liquid 20, and thus the second liquid 30 dropped on the surface of the first liquid 20 can form a partial recess on the surface of the first liquid 20 under the action of gravity, which will decrease the thickness of the center of the first liquid 20. Then, the substrate 10 is rotated, the first liquid 20 will diffuse towards the edge of the substrate 10 under the action of a centrifugal force, and the second liquid 30 will diffuse on the surface of the first liquid 20 under the action of the centrifugal force. Referring to FIG. 4, as the surface of the first liquid 20 is pressed by the second liquid 30, after diffusion, the thickness from the center to the edge region of the first liquid 20 will be more uniform.

In some embodiments, the first liquid is dropped at the center of the surface of the substrate, and thus when the substrate is rotated, the first liquid is diffused from the center of the substrate to the periphery of the substrate, and thus is more uniformly distributed on the substrate.

In some embodiments, the second liquid is dropped at the center of the surface of the first liquid, such that the distribution of the second liquid on the first liquid will be more uniform.

In some embodiments, the method for rotating the substrate comprises the following operations. The substrate is first rotated in a clockwise manner at a first speed for a first preset time, and then the substrate is rotated in a counter-clockwise manner at a second speed for a second preset time, wherein the first speed is greater than the second speed. In this way, the thickness from the center to the edge region of the first liquid can be more balanced under the action of forward and reverse centrifugal forces.

In some embodiments, after dropping the first liquid onto the substrate and before dropping the second liquid onto the first liquid, the method may further comprise the following operation.

At S110, the substrate is rotated, such that the first liquid diffuses, to a first area, on the surface of the substrate.

In order to facilitate the dropping of the second liquid onto the first liquid, before dropping the second liquid, the surface of the first liquid can be enlarged to the first area by rotating the substrate, so that the surface area of the first liquid is greater, facilitating dropping of the second liquid.

In some embodiments, the first area has a size of at least 1/3 of a total area of the substrate. That is to say, the first area is 1/3 to 3/3 of the total area of the substrate, such as 1/3, 2/3 and 3/3, which is not limited in the embodiments of the present disclosure. In order that the first liquid does not overflow from the edge of the substrate when the substrate is rotated for the second time, the size of the first area can be set to be 1/3 of the total area of the substrate.

In some embodiments, the first area is 1 to 3 times the initial area of the second liquid, for example, 1.5 times, 2 times, 2.5 times, or 3 times, which is not limited in the embodiments of the present disclosure. Of course, in order to facilitate the dropping of the second liquid onto the first liquid and to make the second liquid exert a better pressing effect on the first liquid, for example, the first area may be set to be 1.2 times the initial area of the second liquid.

Referring to FIG. 1, in some embodiments, the coating method may further comprise the following operation.

At S400, the second liquid on the surface of the first liquid is removed.

As the function of the second liquid is to press the surface of the first liquid by gravity after the first liquid is rotated and diffused, so as to make the thickness of the first liquid uniform, the second liquid needs to be removed after the diffusion of the first liquid is completed.

In some embodiments, the operation that the second liquid on the surface of the first liquid is removed may comprise the following operation.

The first liquid and the second liquid are baked, such that the second liquid is volatilized from the surface of the first liquid.

In the process of removing the second liquid on the surface of the first liquid, the second liquid is removed in the form of evaporation by baking. As the second liquid is located on the surface of the first liquid, in the baking process, the first liquid evaporates only after the second liquid is completely evaporated, and thus the removal of the second liquid can be accurately controlled by controlling the evaporation time.

In some other embodiments, the operation that the second liquid on the surface of the first liquid is removed may alternatively or additionally comprise the following operation: the second liquid is removed by absorbing; or the second liquid is removed by laser ablation. For example, after the diffusion of the first liquid on the substrate is completed, the second liquid can be sucked away from the surface of the first liquid by means of an absorption device, or the second liquid can be ablated and stripped by means of a laser device.

In some embodiments, the second liquid comprises a volatile liquid. In this way, there is no need to particularly treat the second liquid, and the second liquid can be spontaneously and automatically evaporated from the surface of the first liquid, so that the process of removing the second liquid is simpler.

In some embodiments, the boiling point of the first liquid is greater than the boiling point of the second liquid.

In the described implementation process, as the boiling point of the first liquid is greater than the boiling point of the second liquid, the removal of the second liquid can be achieved by controlling the temperature to be greater than the boiling point of the second liquid and less than the boiling point of the first liquid. In this way, the evaporation time in this process does not need to be accurately controlled, and the operation is more convenient.

In some embodiments, the surface tension of the first liquid is less than the surface tension of the substrate, and the surface tension of the second liquid is less than the surface tension of the first liquid, so that the first liquid is easily diffused and spread on the substrate, and the second liquid is easily diffused and spread on the surface of the first liquid.

In some embodiments, the first liquid comprises a photoresist.

As the photoresist has a relatively high viscosity, when the photoresist is diffusing on the substrate, the situation that the thickness at the central region and the edge region are not uniform easily occurs. For preventing the situation of non-uniformity from happening, the diffusion thickness of the photoresist needs to be adjusted, so as to improve the product quality of a semiconductor. In some other embodiments, the first liquid may alternatively comprise a liquid having a high viscosity, such as resin.

In some embodiments, the second liquid comprises perfluorooctane, tetrahydrofuran, and methyl ethyl ketone.

Perfluorooctane, tetrahydrofuran and methyl ethyl ketone are all common materials in semiconductor manufacturing, and thus can be easily acquired. Besides, perfluorooctane, tetrahydrofuran and methyl ethyl ketone all have relatively small boiling points, and thus can be easily removed by evaporation.

Figure 5:
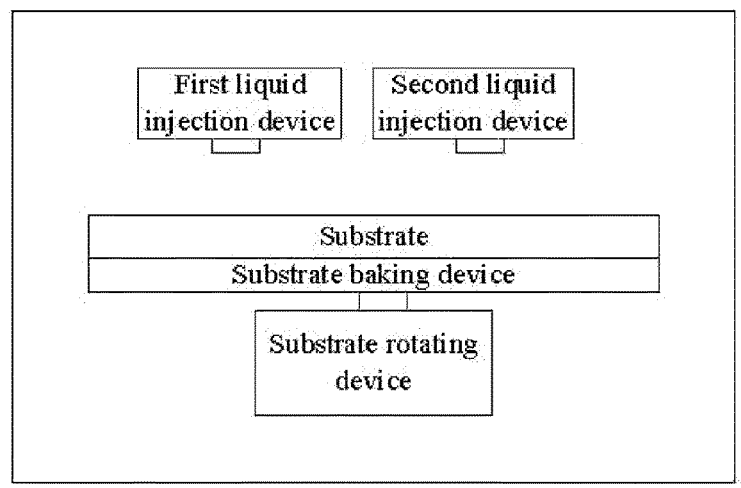
FIG. 5 is a schematic diagram of a structure of a coating system according to some embodiments of the present disclosure.

In addition, referring to FIG. 5, on the basis of the same inventive concept, some embodiments of the present disclosure provide a coating system, comprising:

a substrate;

a first liquid injection device, configured to drop a first liquid onto the substrate;

a second liquid injection device, configured to drop a second liquid onto the first liquid, wherein the second liquid and the first liquid are immiscible, and the first liquid has a density greater than that of the second liquid; and a substrate rotating device, configured to drive the substrate to rotate, such that the first liquid is diffused on the surface of the substrate, and the second liquid is diffused on the surface of the first liquid.

In the coating system of some embodiments of the present disclosure, the first liquid injection device drops the first liquid onto the substrate, the second liquid injection device drops the second liquid onto the substrate, and then the substrate is rotated by the substrate rotating device such that the first liquid is diffused on the surface of the substrate and the second liquid is diffused on the surface of the first liquid. By pressing the surface of the first liquid by means of the gravity of the second liquid, the thickness of the first liquid can be more uniform.

In some embodiments, the coating system may further comprise:

a substrate baking device, configured to bake the first liquid and the second liquid.

In the coating system of some embodiments of the present disclosure, the first liquid and the second liquid are diffused on the substrate and then placed into the substrate baking device for baking, so that the second liquid can be evaporated and removed from the surface of the first liquid. This process of removing the second liquid is convenient.

In some embodiments, the first liquid comprises a photoresist, and the second liquid comprises perfluorooctane, tetrahydrofuran, and methyl ethyl ketone.

The coating system of some embodiments of the present disclosure is used for controlling the thickness of coated photoresist. The second liquid which comprises perfluorooctane, tetrahydrofuran and methyl ethyl ketone has good adaptability to the photoresist and is easily removed, and can achieve a good effect of making the photoresist be coated more uniformly.

In conclusion, the embodiments of the present disclosure provide a coating method and a coating system. The coating method comprises: providing a substrate, and dropping a first liquid onto the substrate; dropping a second liquid onto the first liquid; and rotating the substrate, such that the first liquid is diffused on the surface of the substrate, and the second liquid is diffused on the surface of the first liquid. In the coating method of the embodiments of the present disclosure, as the second liquid immiscible with the first liquid is dropped onto the first liquid and the density of the first liquid is greater than the density of the second liquid, the second liquid can always be above the first liquid. When the substrate is rotated, the first liquid diffuses towards the edge of the substrate under the action of a centrifugal force, and the second liquid diffuses on the surface of the first liquid under the action of the centrifugal force. As the surface of the first liquid is pressed by the second liquid, after diffusion, the thickness of the first liquid will be more uniform.

It should be understood that uses of some embodiments of the present disclosure are not limited to the described examples, and a person having ordinary skill in the art can make improvements or modifications according to the described illustrations, and all these improvements and modifications shall belong to the scope of protection of the appended claims of the present disclosure.

What is claimed is:

1. A coating method, comprising:
   providing a substrate, and dropping a first liquid onto the substrate, wherein the first liquid comprises a photoresist;
   dropping a second liquid onto the first liquid, wherein the first liquid and the second liquid are immiscible, and the first liquid has a density greater than that of the second liquid; and
   rotating the substrate, such that the first liquid is diffused on the surface of the substrate, and the second liquid is diffused on the surface of the first liquid.

2. The coating method according to claim 1, wherein after dropping the first liquid onto the substrate and before dropping the second liquid onto the first liquid, the method further comprises:
   rotating the substrate, such that the first liquid diffuses, to a first area, on the surface of the substrate.

3. The coating method according to claim 2, wherein the first area is at least 1/3 of a total area of the substrate.

4. The coating method according to claim 2, wherein the first area is 1 to 3 times an initial area of the second liquid.

5. The coating method according to claim 1, wherein the coating method further comprises:
   removing the second liquid on the surface of the first liquid.

6. The coating method according to claim 5, wherein removing the second liquid on the surface of the first liquid comprises:
   baking the first liquid and the second liquid, such that the second liquid is volatilized from the surface of the first liquid.

7. The coating method according to claim 5, wherein removing the second liquid on the surface of the first liquid further comprises:
   removing the second liquid by absorbing; or
   removing the second liquid by laser ablation.

8. The coating method according to claim 1, wherein the first liquid has a boiling point greater than that of the second liquid.

9. The coating method according to claim 1, wherein the second liquid comprises perfluorooctane, tetrahydrofuran and methyl ethyl ketone.

10. The coating method according to claim 1, wherein the first liquid is dropped at the center of the surface of the substrate.

11. The coating method according to claim 1, wherein the second liquid is dropped at the center of the surface of the first liquid.

12. The coating method according to claim 1, wherein rotating the substrate comprises: rotating the substrate in a clockwise manner at a first speed for a first preset time, and then rotating the substrate in a counterclockwise manner at a second speed for a second preset time, wherein the first speed is greater than the second speed.

13. The coating method according to claim 1, wherein the second liquid has a surface tension less than that of the first liquid.

14. The coating method according to claim 1, wherein the second liquid comprises a volatile liquid.

* * * * *